(12) United States Patent
Nair et al.

(10) Patent No.: US 7,256,615 B2
(45) Date of Patent: Aug. 14, 2007

(54) CONFIGURABLE HIGH/LOW SIDE DRIVER USING A LOW-SIDE FET PRE-DRIVER

(75) Inventors: Balakrishnan Nair Vijayakumaran Nair, Singapore (SG); Kevin M. Gertiser, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 145 days.

(21) Appl. No.: 11/105,841

(22) Filed: Apr. 14, 2005

(65) Prior Publication Data

US 2006/0170457 A1 Aug. 3, 2006

Related U.S. Application Data

(60) Provisional application No. 60/648,463, filed on Jan. 31, 2005.

(51) Int. Cl.
*H03K 19/0175* (2006.01)

(52) U.S. Cl. ............................. 326/82; 326/83; 326/84; 326/89

(58) Field of Classification Search ............ 326/82–84, 326/89, 109–110; 327/107–112
See application file for complete search history.

(56) References Cited

U.S. PATENT DOCUMENTS

| 5,293,082 A | * | 3/1994 | Bathaee ...................... 327/108 |
| 2005/0179472 A1 | * | 8/2005 | Nakamura et al. .......... 327/109 |

* cited by examiner

*Primary Examiner*—Anh Q. Tran
(74) *Attorney, Agent, or Firm*—Jimmy L. Funke

(57) ABSTRACT

A high-side driver circuit for driving a load, including a low-side driver IC having a drive output and a feedback input, a first transistor coupled to the drive output, and a second transistor coupled between a power source and the load. The second transistor is configured to enter an "OFF" state when the first transistor is driven into an "OFF" state by the drive output, and to enter an "ON" state when the first transistor is driven into an "ON" state by the drive output.

17 Claims, 2 Drawing Sheets

CONFIGURABLE HIGH/LOW SIDE DRIVER USING A LOW-SIDE FET PRE-DRIVER

This application claims benefit of 60/648,463, filed on Jan. 31, 2005.

FIELD OF THE INVENTION

The present invention generally relates to driver circuits and more particularly to a configurable high/low side driver circuit using a low-side FET pre-driver.

BACKGROUND OF THE INVENTION

Engine control modules (ECMs) for powertrain applications generally include controllers, such as the MY 2008 MT40 series controllers provided by Delphi Automotive Systems. These controllers have applications on various vehicles made by several different manufacturers. For example, CAM phasor outputs are generally driven by such controllers to improve idle smoothness and obtain improved power curves at high speeds. Some of these applications require driver circuits that function as low-side drivers, while other applications require high-side drivers.

As low-side drivers are generally less expensive than high-side drivers, most vehicle manufacturers require low-side drivers. Other manufacturers, however, specify high-side drivers because they believe the increased cost is justified by the desire to avoid undesirable effects of shorts to ground (which may be more likely and prevalent than shorts to battery) and to remove power from the load during a short to ground. Unfortunately, not only are conventional high-side drivers, such as the miniPROFET® BSP 452 by Infineon Technologies, generally more expensive, but they also occupy limited printed circuit board ("PCB") space, increase complexity and component count, and typically require additional microprocessor resources (normally quite limited in such applications) for drive and fault diagnostics. Moreover, as relatively few applications specify high-side drivers, the cost of implementing a high-side driver would become carrying cost for the remaining controllers. This is undesirable as such controllers are frequently used in cost-sensitive applications.

Additionally, conventional high-side drivers do not facilitate fault detection as efficiently as low-side drivers. Off-the-shelf high-side driver ICs current limit their outputs during a short circuit event, and remain powered a relatively long period of time (typically approximately 200 microseconds) or in some cases until the junction temperature exceeds a shut-off threshold. This thermal shut-off approach may require heat sinking or heat removal measures. These short circuit event operating conditions are stressful and may degrade the performance and/or operating life of the device.

SUMMARY OF THE INVENTION

The present invention provides a high-side driver capability using the inexpensive low-side FET pre-drivers commonly used in ECM controllers. Instead of adding a relatively expensive, space and resource consuming high-side driver IC, the circuits according to the present invention function with the low-side driver commonly used in many powertrain applications to enable the controller to provide high-side drive capabilities. Additionally, the circuits provide fault detection which is transparent to the diagnostic software for either low-side driver operation or high-side driver operation, and reduce the currents experienced during fault conditions.

In one embodiment, the invention provides a high-side driver circuit for driving a load, including a low-side driver IC having a drive output and a feedback input, a first transistor coupled to the drive output, and a second transistor coupled between a power source and the load. The second transistor is configured to enter an "OFF" state when the first transistor is driven into an "OFF" state by the drive output, and to enter an "ON" state when the first transistor is driven into an "ON" state by the drive output.

In another embodiment, the invention provides a controller that may be configured either as a high-side driver or a low-side driver. When configured as a high-side driver, the high-side driver circuit described above is populated on a printed circuit board ("PCB") of the controller. When configured as a low-side driver, the high-side driver circuit is not populated on the PCB. Instead, a transistor is coupled between the drive output of the low-side driver IC and the load. The third transistor is configured to connect the load to ground when in an "ON" state and to disconnect the load from ground when in an "OFF" state.

The features and advantages of the present invention described above, as well as additional features and advantages, will be readily apparent to those skilled in the art upon reference to the following description and the accompanying drawings.

DETAILED DESCRIPTION OF EMBODIMENTS OF THE INVENTION

The embodiments described below are merely exemplary and are not intended to limit the invention to the precise forms disclosed. Instead, the embodiments were selected for description to enable one of ordinary skill in the art to practice the invention.

Figure 1:
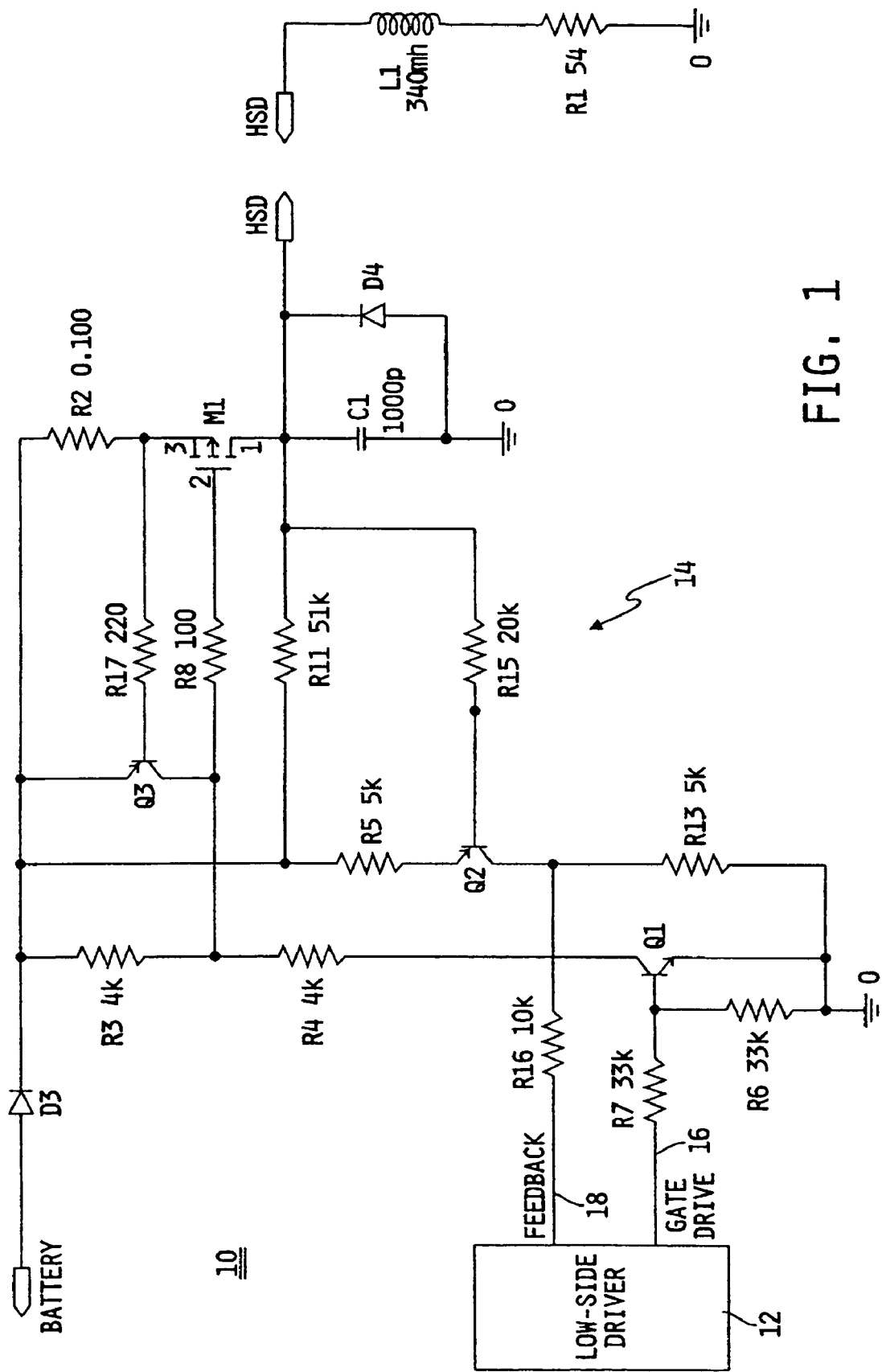
FIG. 1 is a schematic diagram of one embodiment of a circuit according to the present invention.

Referring now to FIG. 1, one embodiment of a circuit 10 according to the present invention includes a low-side FET pre-driver 12 configured to implement a high-side driver 14. In circuit 10, the gate drive output 16 of driver 12 is connected to a voltage divider network R6, R7, the common node of which is connected to the base of a transistor Q1, the emitter of which is connected to ground. The collector of transistor Q1 is connected, through resistors R3 and R4, and diode D3 to a power source (e.g., battery power).

The feedback input 18 of driver 12 is connected to a voltage divider network R13, R16, the common node of which is connected to the collector of a transistor Q2. Transistor Q2 is configured as an inverting amplifier operating in a linear mode with gain to provide feedback to feedback input 18. It should be understood that the gain of the inverting amplifier may be optimized to best utilize the (adjustable) voltage detection capability of driver 12. The base of transistor Q2 is connected through resistor R15 to the high-side driver load (not shown). The emitter of transistor Q2 is connected, through resistor R5 and diode D3, to battery power. A resistor R11 is connected between the load and, through diode D3, battery power to enhance the open circuit detection of the circuit as is further described below.

The gate of a PFET transistor M1 is connected through resistor R8 to the collector of transistor Q3 and the common node of resistors R3 and R4. The drain of FET M1 is connected to the load, as well as to capacitor C1 and the cathode of diode D4. The other side of capacitor C1 and the anode of diode D4 are connected to ground. The return side of the load is connected through inductor L1 and resistor R1 to ground. The source of FET M1 is connected, through resistor R2 and diode D3, to battery power, and through resistor R17 to the base of transistor Q3. The emitter of transistor Q3 is connected through diode D3 to battery power.

In operation, when gate drive output 16 is high, sufficient voltage is generated at the base of transistor Q1 to cause the transistor to conduct current. When transistor Q1 is in this "ON" state, the voltage at the gate of FET M1 is pulled sufficiently low to activate FET M1. Under these conditions, transistor Q2 is in the linear mode, causing the voltage drop across resistor R13 to result in a voltage at feedback input 18 to driver 12 of less than the fault threshold voltage of driver 12 in the "ON" state. It should be understood that the ratio of resistance values of resistors R5 and R13 are selected such that the gain of the circuit is compatible with the feedback threshold voltage. It should further be understood that the feedback threshold voltage may be programmed via a serial peripheral interface or set using an external resister divider network. Also, as an inverting voltage drive stage is utilized to drive FET M1 into the "ON" and the "OFF" states in a balanced manner, the drive circuit may be useful for pulse width modulated outputs. Additionally, the circuit topology supports high current loads as effectively as low current loads.

When gate drive output 16 is low, transistor Q1 is in the "OFF" state, thereby causing the voltage at the gate of FET M1 to return to the battery voltage. Consequently, FET M1 enters the "OFF" state. Transistor Q2 essentially monitors the voltage across the drain and the source of FET M1 and transposes a scaled version of that voltage across resistor R13. When FET M1 is in the "OFF" state, the voltage at feedback input 18 is approximately one-half the battery voltage (in the preferred embodiment) (i.e., above the fault threshold voltage). As such, driver 12 operates as if it were driving a low-side FET because the voltage drop on the high side is transposed to the low side by the transistor Q2 circuit.

Among other things, the circuit of FIG. 1 provides for detection of open and short circuits to the battery voltage when high-side driver 14 is in the "OFF" state. More specifically, when FET M1 is "OFF," the base of transistor Q2 is normally pulled to ground through the load (and inductor L1 and resistor R1). In this condition, the voltage at feedback input 18 ("the feedback voltage") is greater than the fault threshold voltage (here, approximately one-half the value of the battery voltage). As the feedback voltage is greater than the threshold voltage, no fault is reported.

If, on the other hand, the connection to the load (i.e., the drain of FET M1) becomes opened, the base of transistor Q2 is pulled toward the battery voltage through resistors R11 and R15. When the voltage of the base of transistor Q2 is close to the battery voltage, the voltage across resistor R13 approaches zero. Thus, the feedback voltage to driver 12 falls below the fault threshold voltage, and driver 12 registers a fault that can be read through the serial peripheral interface.

If, on the other hand, the connection to the load is shorted to the battery voltage, the base of transistor Q2 is pulled through resistor R15 toward the battery voltage. Again, when the base of transistor Q2 approaches the battery voltage, the voltage across resistor R13, and therefore the feedback voltage to driver 12, falls below the fault threshold voltage as it approaches zero. This also causes driver 12 to register a fault. Accordingly, when high-side driver 14 is in the "OFF" state, faults reported by driver 12 indicate either a short to battery condition or an open connection to the load.

Circuit 10 of FIG. 1 also provides for detection of short to ground or over-current conditions. In either situation, circuit 10 will shut off high-side driver circuit 14. When FET M1 is in the "ON" state (i.e., when gate drive output 16 is high), the feedback voltage at feedback input 18 is below the fault threshold voltage as explained above. If the load is shorted to ground under these conditions, the voltage across FET M1 and the sense resistor R2 (i.e., the voltage from the drain of FET M1 to the top of resistor R2 as shown in FIG. 1) increases. As a result, transistor Q2 begins conducting current which generates an increased voltage across resistor R13 and at feedback input 18 of low-side driver 12. When the voltage at feedback input 18 exceeds the fault threshold voltage, driver 12 registers a fault and drives gate drive output 16 low to disable FET M1 in the manner described above. As such, FET M1 is disabled quickly (on the order of 30 microseconds). As should be apparent from the foregoing, as low-side driver 12 is used to detect such faults at high-side driver circuit 14, a short to ground or over-current fault at high-side driver circuit 14 is reported in the same manner as a short to battery fault at low-side driver 12.

It should be understood that circuit 10 provides a FET gate drive "pinch-off" circuit which provides robust fault detection capability by ensuring de-saturation of FET M1. More specifically, transistor Q3 in combination with resistor R2 causes FET M1 to enter the "OFF" state when the current flow through FET M1 becomes excessive. If, for example, five to seven amps begins to flow through FET M1, the voltage across resistor R2 will be 0.5 to 0.7 volts, which will cause transistor Q3 to conduct. FET M1 starts to "pinch off," and the drain-to-source voltage rapidly increases, thus making it easier to de-saturate FET M1 at nominal current flow. Although this circuit is not essential to the operation of the short circuit protection mechanism, it does offer more accurate (enhanced) current limit control and protection.

Figure 2:
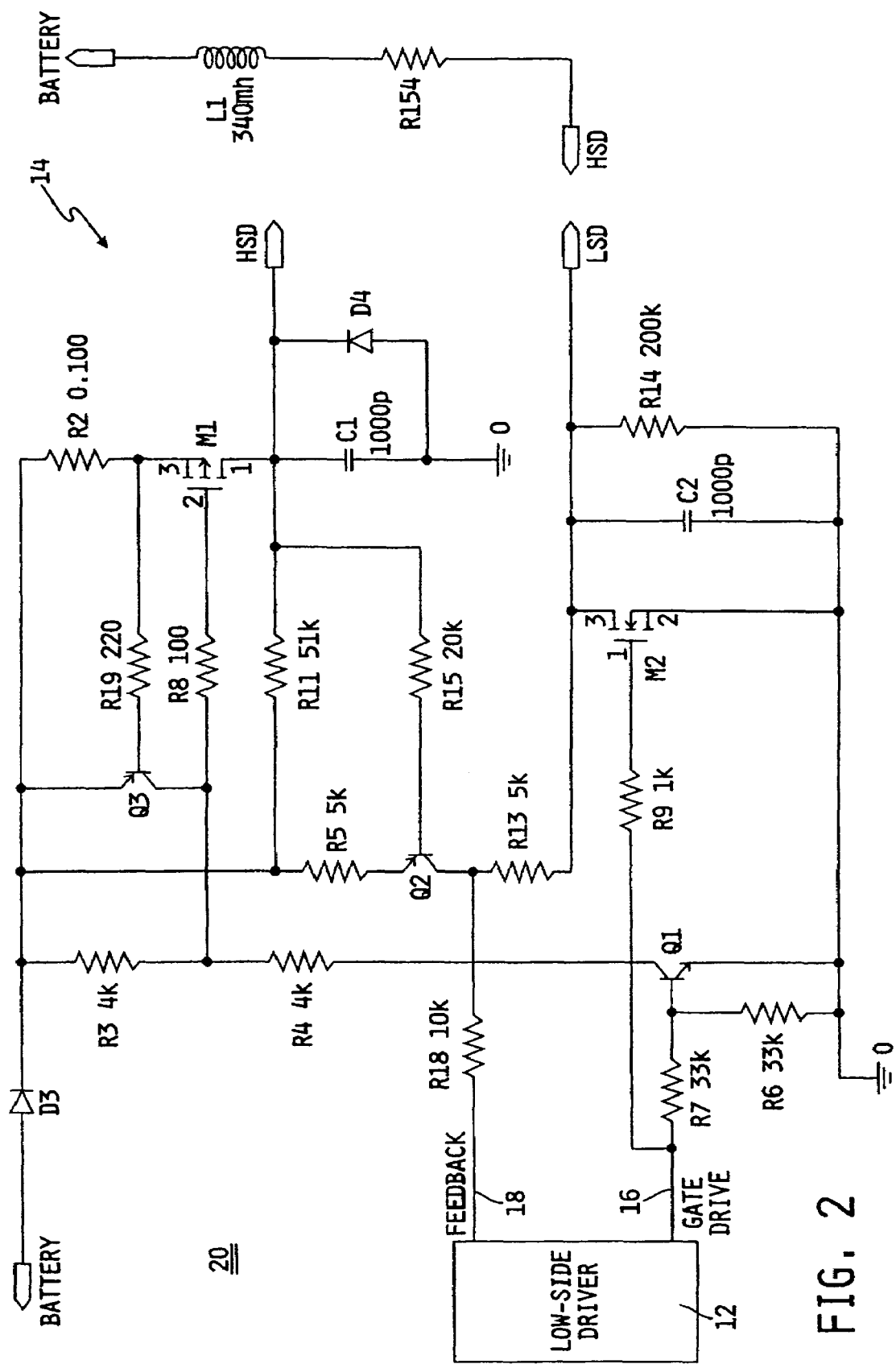
FIG. 2 is a schematic diagram of another embodiment of a circuit according to the present invention.

FIG. 2 depicts an alternative circuit 20 which is configured for use either as a low-side driver or a high-side driver. Circuit 20 differs from circuit 10 primarily in that an NFET transistor M2 is added. Resistor R9 is connected between gate drive output 16 and the gate of FET M2. Resistor R14 and capacitor C2 are connected in parallel across the source and drain of FET M2. The source of FET M2 is connected to the low side of the load (not shown) and to resistor R13. The drain of FET M2 is connected to ground.

In applications where a high-side driver is not needed, all of the components of circuit 20 are removed except low-side driver 12, FET M2, resistors R9, R13, R14 and R18, and capacitor C2. In this depopulated configuration, circuit 20 functions as a low-side driver wherein gate drive output 16 drives FET M2 between the "ON" and "OFF" states to connect and disconnect the load to ground. Alternatively, FET M2 may be removed from circuit 20 and resistor R14 may be replaced with a jumper or zero ohm resistor. In this configuration, circuit 20 functions as a high-side driver in the manner described above. As such, the same circuit board and control software may be used for high-side driver and low-side driver applications.

It should be understood that transistors Q1 and Q2 may be packaged in the same device to reduce component count. Similarly, FET M1 and FET M2 may also be packaged together.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A high-side driver circuit for driving a load, the circuit including:
   a low-side driver IC having a drive output and a feedback input;
   a first transistor coupled to the drive output; and
   a second transistor coupled between a power source and the load; wherein the second transistor is configured to enter an "OFF" state when the first transistor is driven into an "OFF" state by the drive output, and to enter an "ON" state when the first transistor is driven into an "ON" state by the drive output, and
   a third transistor coupled between the load and the feedback input such that the third transistor creates a first feedback voltage at the feedback input that is greater than a fault threshold voltage of the low-side driver IC when the second transistor is in the "OFF" state, and a second feedback voltage at the feedback input that is less than the fault threshold voltage when the second transistor is in the "ON" state.

2. The circuit of claim 1 wherein the third transistor is configured as an inverting amplifier with a gain that corresponds to the fault threshold voltage.

3. The circuit of claim 1 wherein the second transistor is a PFET transistor.

4. The circuit of claim 1 further including a voltage divider network coupled between the feedback input and a collector of the third transistor.

5. The circuit of claim 1 wherein the third transistor is configured to cause the first feedback voltage to approach zero when the second transistor is in the "OFF" state and a connection to the load becomes one of opened and shorted to the power source, thereby indicating a fault condition.

6. The circuit of claim 1 wherein the third transistor is configured to cause the second feedback voltage to exceed the fault threshold voltage when the second transistor is in the "ON" state and a connection to the load becomes shorted to ground, thereby indicating a fault condition.

7. The circuit of claim 6 wherein the low-side driver is configured to cause the drive output to drive the first transistor into the "OFF" state upon detection of the fault condition.

8. The circuit of claim 1 further including a fourth transistor coupled between the drive output and the load, the fourth transistor being configured to connect the load to ground when in an "ON" state and to disconnect the load from ground when in an "OFF" state.

9. The circuit of claim 1 further including a fourth transistor coupled to the second transistor, the fourth transistor being configured to cause the second transistor to enter the "OFF" state when a current flow through the second transistor exceeds a predetermined amount.

10. A configurable controller for an ECM, including:
    a PCB; and
    a low-side driver IC mounted to the PCB;
    the PCB being configured to receive a first transistor for functioning as a low-side driver and a second transistor for functioning as a high-side driver
    wherein the first transistor is not mounted to the PCB when the second transistor is mounted to the PCB.

11. The controller of claim 10 wherein the first transistor is an NFET transistor and the second transistor is a PFET transistor.

12. A high-side driver circuit, including:
    a low-side driver IC having a drive output;
    a first transistor coupled to the drive output for switching a second transistor coupled to a power source and a load between an "ON" state wherein power is applied to the load and an "OFF" state wherein power is not applied to the load; and
    a third transistor configured to monitor a voltage associated with the second transistor and cause a feedback voltage corresponding to the monitored voltage to be generated at a feedback input of the low-side driver IC.

13. The circuit of claim 12 wherein the third transistor is configured to cause the feedback voltage to fall below a fault threshold voltage of the low-side driver IC when the second transistor is in the "OFF" state and a connection to the load becomes one of opened and shorted to the power source, thereby indicating a fault condition.

14. The circuit of claim 12 wherein the third transistor is configured to cause the feedback voltage to exceed a fault threshold voltage of the low-side driver IC when the second transistor is in the "ON" state and the load draws current in excess of a predetermined amount, thereby indicating a fault condition.

15. The circuit of claim 14 wherein the low-side driver is configured to cause the first transistor to switch the second transistor into the "OFF" state upon detection of the fault condition.

16. The circuit of claim 12 further including a fourth transistor coupled between the drive output and the load, the fourth transistor being configured to connect the load to ground when in an "ON" state and to disconnect the load from ground when in an "OFF" state.

17. The circuit of claim 12 further including a fourth transistor coupled to the second transistor, the fourth transistor being configured to cause the second transistor to enter the "OFF" state when a current flow through the second transistor exceeds a predetermined amount.

* * * * *